United States Patent [19]

Bushman

[11] Patent Number: 5,764,111
[45] Date of Patent: Jun. 9, 1998

[54] VOLTAGE CONTROLLED RING OSCILLATOR FREQUENCY MULTIPLIER

[75] Inventor: Michael L. Bushman, Hanover Park, Ill.

[73] Assignee: Motorola Inc., Schaumburg, Ill.

[21] Appl. No.: 801,444

[22] Filed: Feb. 18, 1997

[51] Int. Cl.⁶ .................................................. H03B 27/00
[52] U.S. Cl. ............................ 331/57; 331/60; 331/108 C; 331/1 A
[58] Field of Search ........................ 331/57, 108 C, 331/1 A, 49, 60

[56] References Cited

U.S. PATENT DOCUMENTS

| | | | |
|---|---|---|---|
| 3,626,315 | 12/1971 | Stirling et al. | 331/19 |
| 3,916,335 | 10/1975 | Masson | 331/4 |
| 3,978,431 | 8/1976 | Lattin | 331/108 C |
| 4,644,358 | 2/1987 | Sekine | 342/356 |
| 4,910,471 | 3/1990 | Grahmbhatt et al. | 331/57 |
| 5,157,356 | 10/1992 | Wedge | 331/60 |
| 5,239,274 | 8/1993 | Chi | 331/57 |
| 5,345,186 | 9/1994 | Lesmeister | 328/15 |
| 5,428,318 | 6/1995 | Razavi | 331/57 |
| 5,559,477 | 9/1996 | Tozun et al. | 331/97 |
| 5,638,030 | 6/1997 | Du | 331/57 |
| 5,668,504 | 9/1997 | Rodriques Ramalho | 331/1 A |

*Primary Examiner*—David C. Nelms
*Assistant Examiner*—Hoai Ho
*Attorney, Agent, or Firm*—Brian M. Mancini

[57] ABSTRACT

A voltage controlled ring oscillator (10) integrated with a phase locked loop (101) using CMOS technology. The ring oscillator (10) provides a frequency multiplied harmonic output frequency (42) at a frequency of 2.5 GHz or more while operating at only one-third of that frequency. The ring oscillator (10) uses an odd number of inverter stages (12, 14, 16) and provides high frequency CMOS operation by utilizing the phase shifted signals of the ring frequency at each ring inverter output (20, 24, 28). The ring oscillator (10) draws minimal current and is incorporated in a frequency synthesizer (100) used in a radio communication device (200).

19 Claims, 1 Drawing Sheet

VOLTAGE CONTROLLED RING OSCILLATOR FREQUENCY MULTIPLIER

FIELD OF THE INVENTION

The present invention relates generally to voltage controlled oscillators used in a phase locked loop of a radio communication device and, in particular, to a ring oscillator frequency multiplier integrated using complementary-metal-oxide semiconductor (CMOS) technology.

BACKGROUND OF THE INVENTION phase locked loops provide a means for synthesizing a clock having a frequency that is precisely synchronized to a reference at a different frequency. The clock is generated by a voltage controlled oscillator (VCO) having its phase regulated by a phase comparison to the reference. In one typical application, a selected clock frequency is generated from a reference frequency by: dividing the clock frequency by a first selected number A, dividing the reference frequency by a second selected number B, and comparing the phase of the two quotient signals to derive a phase difference signal that is used as a control signal to the VCO. When a condition of phase lock is achieved in the phase locked loop, the clock frequency is related to the reference frequency by the ratio A/B.

The conventional method of using a phase locked loop for generating a clock frequency suffers from the disadvantage that the VCO must operate at a frequency that is higher than the reference frequency. This limitation has increased the difficulty of integrating the VCO directly onto a semiconductor chip incorporating the phase locked loop. Generally, CMOS technology is a slower technology than bipolar and cannot achieve the high frequencies needed. Currently, an RF VCO operating at 2.5 GHz can only be implemented in discrete form, separate from the phase locked loop, to meet the high frequency requirements. Further, the discrete implementation of the VCO can be current intensive and can require bipolar prescaling if an integrated CMOS phase locked loop is used for frequency synthesis. As communication electronics move toward more fully integrated low power requirements, a solution is needed to provide a fully integrated VCO and phase locked loop for frequency synthesis in CMOS technology which is capable of low current, high frequency operation.

Therefore, there is a need for a ring oscillator in a VCO which: is fully integratable with a phase locked loop using CMOS technology, draws very little current, and provides frequencies of 2.5 GHz or more. In addition, it is desirable to provide a low cost, small sized, high yield ring oscillator that can provide harmonic output frequencies.

DETAILED DESCRIPTION OF THE PREFERRED EMBODIMENT

Figure 1:
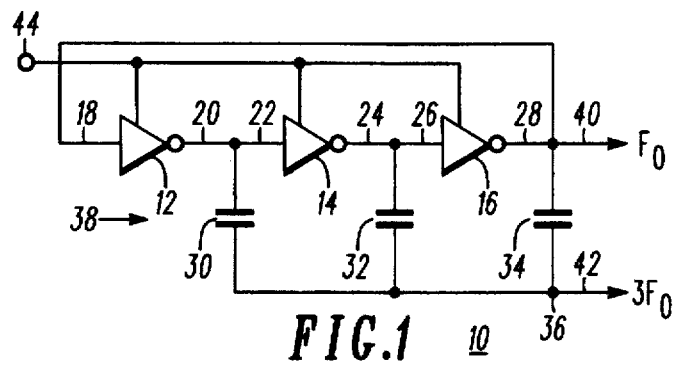
FIG. 1 is a schematic diagram of a voltage controlled ring oscillator using three inverters, in accordance with the present invention.

FIG. 1 shows a three inverter ring oscillator 10 including a first, second and third inverter 12, 14, 16 each with an input and an output 18, 20, 22, 24, 26, 28. The ring oscillator 10 is configured such that the output 20 of the first inverter 12 is electrically coupled with the input 22 of the second inverter 14, the output 24 of the second inverter 14 is electrically coupled with the input 26 of the third inverter 16, and the output 28 of the third inverter 16 is electrically coupled with the input 18 of the first inverter 12. The ring oscillator 10 also includes a first, second and third summing component 30, 32, 34 which tap into each stage of the ring oscillator 10. The summing components 30, 32, 34 each having one end electrically coupled to the first, second and third inverter outputs 20, 24, 28, respectively. The other ends of the summing components 30, 32, 34 are commonly electrically connected at a common node 36 which produces the desired multiplied output frequency 42. The output 28 of the third inverter 1 6 provides a fundamental output frequency 40, and the common node 36 provides a desired third-harmonic output frequency 42.

The summing components 30, 32, 34 are selected from at least one of the group of passive components consisting of resistors, capacitors or inductors. In a preferred embodiment, capacitors are used because they are easily integrated, unlike resistor and inductors, and they have low current draw, unlike resistors. It should be recognized that in some applications requiring higher current or a buffered output frequency, the multiplied frequency output 42 can be capacitively coupled to a discrete power transistor or amplifier (not shown) to provide a buffered frequency output of the multiplied frequency. However, this is not necessary for the operation of the present invention.

A major advantage of the present invention is that the voltage controlled ring oscillator can be provided on an integrated circuit along with an associated phase locked loop. In addition, CMOS technology can be used for the integrated circuit, which advantageously lowers circuit size, current drain and manufacturing cost. Moreover, the multiplied output frequency is derived from a lower frequency and is provided having a period approaching approximately two inverter propagation delays, whereas prior art VCOs generally have frequencies with periods of about six propagation delays for three inverter rings.

In operation, considering the ring oscillator embodiment of FIG. 1, one complete loop cycle of the ring waveform of the ring oscillator requires six propagation delays, three propagation delays for the rising edge of the waveform to pass from the input of the first inverter to the output of the third inverter and three propagation delays for the falling edge of the waveform to pass from the input of the first inverter to the output of the third inverter.

The output of the first inverter can be taken as a reference phase of 0°. The output of the second inverter is then phase shifted by one-sixth of one cycle (i.e. 60°) and inverted (i.e. 180°) relative to the reference phase such that the output of the second inverter is at 240° (or −120°) relative to the output of the first inverter. Likewise, the output of the third inverter is phase shifted 240° from the output of the second inverter, or +480° (or +120°) relative to the output of the first inverter.

CMOS inverter ring oscillators only support odd harmonics due to the odd symmetry of the ring waveform. This can be used to advantage by summing the individual inverter outputs with a simple summing network 38 which includes passive components such as resistors, capacitors, inductors and the like. The resulting summed waveform is:

$$F(t)=a_n\{\cos\ [n(\omega t+0°)]+\cos\ [n(\omega t-120°)]+\cos\ [n(\omega t+120°)]\}$$

where the output of the first inverter is $\cos\ [n(\omega t+0°)]$, the output of the second inverter is $\cos\ [n(\omega t-120°)]$, the output of the third inverter is cos [n(ωt+120°)], and $a_n$ is the amplitude which varies for each harmonic value of n. Since all three phases of each harmonic, n, of the waveform are at the same frequency, the waveform is easily resolved in terms of phasors. The resultant x and y components for each harmonic are:

$$x=\cos(n*0)+\cos(-n*120°)+\cos(n*120°)$$

$$y=\sin(n*0)+\sin(-n*120°)+\sin(n*120°)$$

The y component equals zero since sin (0)=0 and sin (−θ)=−sin (θ). Since cos (0)=1 and cos (−θ)=cos (θ) the x component resolves to $$x=1+2*\cos(n*120°)$$

However, 2*cos (n*120°) can assume only two values for all n;

$$2*\cos(n*120°)=2 \text{ for } n=3, 6, 9, \ldots$$

$$2*\cos(n*120°)=-1 \text{ for } n\neq 3, 6, 9, \ldots$$

Therefore, $$x=3 \text{ for } n=3, 6, 9, \ldots$$

$$x=0 \text{ for } n\neq 3, 6, 9, \ldots$$

and since n can only assume odd values, due to the odd symmetry of the ring waveform of the ring oscillator only supporting odd harmonics, then $$F(t)=a_n\cos[n(\omega t)] \; n=3, 9, 15, \ldots$$

Therefore, the fundamental frequency and every higher order harmonic that is not an odd multiple of three are suppressed at the common node allowing only widely spaced odd-harmonic frequencies which can be easily tuned for proper operation of the ring oscillator and phase locked loop.

This technique has the advantage of providing a multiplied frequency with a period approaching approximately two inverter propagation delays on the third harmonic. As should be recognized, this analysis can be extended to ring inverters with greater numbers of stages (inverters). However in practice, the third harmonic is the only effective harmonic with which to operate since the ninth and higher harmonic frequencies cause other problems in the circuitry associated with the phase locked loop and frequency synthesizer. Moreover, the amplitude, a9, is very small compared to the third harmonic amplitude, a3. It should also be recognized that the ring oscillator 10 operates as a VCO where a control voltage 44 is applied to the inverters 12, 14, 16 of the ring oscillator 10 so as to adjust the transition (propagation) delays of the inverters such that the transition delays of the ring add up to the desired fundamental frequency 40 of operation. The present invention takes advantage of this by using the adjusted fundamental operating frequency 40 to produce the desired multiplied frequency 42.

The ring oscillator 10 beneficially produces an amplitude of the multiplied frequency 42 approximately equal to an amplitude of the third harmonic frequency 40 without additional current drain. The passive summing network 38 voltage divides each amplitude of the ring waveform at each stage of the inverters to produce one-third of the amplitude for each stage at the common node 36. However, since the outputs 20, 24, 26 of three inverters 12, 14, 16 are being summed at the common node 36, the amplitude of the frequency multiplied output 42 is restored to an amplitude equal to the third harmonic of the ring waveform.

The present invention also has the advantage of allowing the output of any single inverter stage to drive a divider of an on-chip phase locked loop with a frequency that is one-third the output frequency. This eliminates the need for a CMOS divider to operate at the desired RF frequency which reduces current draw for the CMOS divider. The current draw in the ring oscillator is also reduced since the ring oscillator is actually running at one-third of the RF output frequency.

Figure 2:
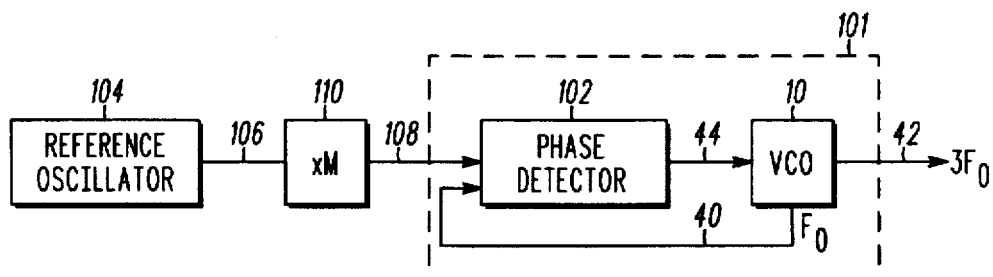
FIG. 2 is a block diagram of frequency synthesizer including one multiplier and using the embodiment of the circuit of FIG. 1, in accordance with the present invention.

The advantage of providing two frequencies from the same circuit in the present invention can be shown by example, with reference to the invention of FIGS. 1 and 2. FIG. 2 shows a frequency synthesizer 100 with a locked loop circuit such as phase locked loop 101 containing a VCO 10 incorporating the ring oscillator of FIG. 1. The output frequency 42, $3f_o$, generated by the VCO 10 has its frequency regulated by a control voltage 44 from a detector such as a phase detector 102. A translated multiplied signal 108 is derived from a reference signal 106 from a reference oscillator 104 which is translated via a frequency translational element such as a multiplier 110 to make the multiplied signal 108. The phase detector 102 compares a phase of a fundamental frequency 40, $f_o$, which is one-third of the output frequency 42 of the VCO, with a phase of the translated multiplied signal 108.

In operation, the output frequency 42 is generated from the reference signal 106 by first multiplying the reference signal 106 by a selected number M in a multiplier 110, and comparing the phase of the translated multiplied signal 108 and the fundamental frequency 40 of the VCO 10 to derive a control voltage 44 (phase difference signal) that is used as a frequency control signal to the VCO. When a condition of phase lock is achieved in the phase locked loop 101, the output frequency 42 is related to the reference signal 106 by the value 3M. For example, a reference signal of 109.65 MHz with a multiplier value, M=7.6, produces an output frequency of; 109.65 MHz*(3*7.6)=2.5 GHz. The advantage of this embodiment over the prior art is that a divider is not required for the loop signal, $f_o$, coming from the VCO.

Figure 3:
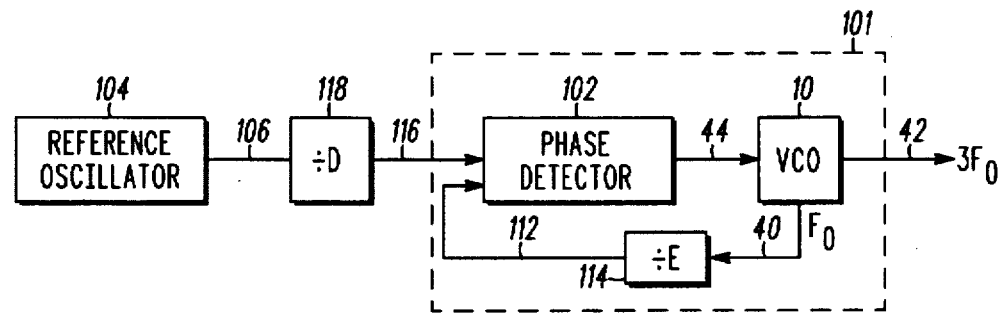
FIG. 3 is a block diagram of frequency synthesizer including two dividers and using the embodiment of the circuit of FIG. 1, in accordance with the present invention.

However, in practice, dividers draw less current and are easier and less costly to implement than multipliers. The present invention can also be used to advantage in this case. For this case, the advantage of providing two frequencies from one VCO in the present invention can be shown by example, with reference to the invention of FIGS. 1 and 3. FIG. 3 shows a frequency synthesizer 100 with phase locked loop 101 containing a VCO 10 incorporating the ring oscillator of FIG. 1. The output frequency 42, $3f_o$, generated by the VCO 10 has its frequency regulated by a control voltage 44 from a phase detector 102. The phase detector 102 compares a phase of a first divided signal 112 derived from the fundamental frequency 40, $f_o$, of the VCO, with a phase of a second divided signal 116 derived from the reference oscillator 104.

In operation, the output frequency 42 is generated from the reference signal 106 by; first, dividing the reference signal 106 by a selected number D in a first divider 118, second, dividing the fundamental frequency 40 by a selected number E in a second divider 114, and third, comparing the phase of the first divided signal 116 and the second divided signal 112 in the phase detector 102 which provides a control voltage 44 (phase difference signal) that is used as a frequency control signal to the VCO 10. When a condition of phase lock is achieved in the phase locked loop 101, the output frequency 42 is related to the reference signal 106 by the value E/D. For example, a reference signal of 109.65 MHz in a frequency synthesizer 100 with a first divider value, D=1096.5, and a second divider value of E=25000, produces an output frequency, $f_o$, of; 109.65 MHz * (E/D) =2.5 GHz. The advantage of this embodiment over the prior art is that the second divider 114 does not need to perform as much dividing since the incoming fundamental frequency 40, $f_o$, from the VCO is already three times lower than the output frequency 42. A lower input frequency to the second divider 114 require less total division which has the advantage of lowering current drain within the frequency synthesizer.

It should be recognized that, in FIGS. 2 and 3, a low-pass loop filter is normally inserted into the line for the control voltage 44, between the phase detector 102 and the VCO 10, to reduce glitches from the phase detector, to integrate the phase error, and to determine the order of the loop frequency. In addition, the phase detector can be replaced by a frequency detector to form a frequency locked loop. Alternatively, the phase detector could be replaced by a delay detector to form a delay locked loop.

Figure 4:
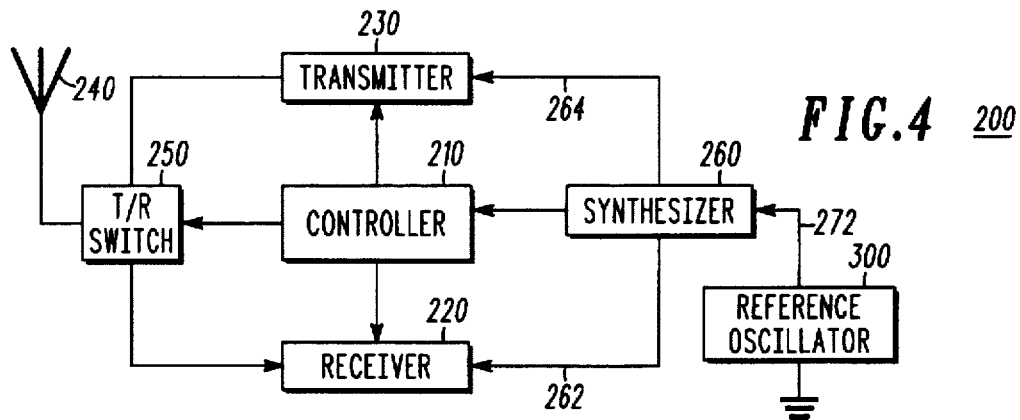
FIG. 4 is a block diagram of a communication device incorporating the embodiment of the circuit of FIG. 1, in accordance with the present invention.

FIG. 4 shows a block diagram of a communication device 200 which includes a frequency synthesizer 260 which contains a ring oscillator frequency multiplier, in accordance with the present invention. In one embodiment, the communication device 200 is a transceiver. The communication device 200 comprises a frequency synthesized two-way transceiver which operates under the control of a microcontroller 210. The communication device 200 includes a receiver 220 and a transmitter 230 which receive and transmit RF via an antenna 240. The antenna 240 is appropriately switched between the receiver 220 and the transmitter 230 by an antenna switch 250. A reference oscillator 300 provides a reference oscillator signal 272 for the synthesizer 260. The synthesizer 260 provides a frequency multiplied receiver local oscillator signal 262 and transmitter local oscillator signal 264. The frequency synthesizer 260 contains a ring oscillator which supplies the frequency multiplied signal utilizing the principles of the present invention.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A voltage controlled ring oscillator having harmonic frequency components, the oscillator comprising:

a first, second and third inverter each with an input and an output, the output of the first inverter electrically coupled with the input of the second inverter, the output of the second inverter electrically coupled with the input of the third inverter, the output of the third inverter electrically coupled with the input of the first inverter; and a first, second and third summing component, the summing components each having one end electrically coupled to an output of the first, second and third inverters, respectively, the other ends of the summing components being commonly electrically connected at a common harmonic frequency output node;

the output of the third inverter providing a fundamental output frequency;

the summing components passively coupling the harmonic frequency components of ring oscillator such that constructive summation of harmonic frequency components occurs for those frequency components, F(t), of a multiple n, being an odd multiple of three in accordance with the formula $$F(t)=a_n\cos(n(\omega t))$$

where (n=3, 9, 15, . . . );

the constructively summed harmonic frequency components being provided at the common harmonic frequency output node, the third-harmonic frequency component at the common harmonic frequency output node having the highest amplitude.

2. The ring oscillator of claim 1, wherein each summing component is selected from at least one of the group consisting of resistors, capacitors and inductors.

3. The ring oscillator of claim 2, wherein the summing components are capacitors.

4. The ring oscillator of claim 1, wherein the third-harmonic frequency output is electrically coupled to a discrete power transistor to provide a buffered third-harmonic frequency signal.

5. The ring oscillator of claim 1, wherein the ring oscillator is provided on an integrated circuit.

6. The ring oscillator of claim 1, wherein a multiplied frequency is provided having a period approaching approximately two inverter propagation delays.

7. A frequency synthesizer including a reference oscillator coupled to a frequency translational element providing a translated signal, comprising:

a locked loop circuit and detector chosen from the group consisting of a phase locked loop with a phase detector, a frequency locked loop with a frequency detector and a delay locked loop with a delay detector;

the translated signal being coupled to a first input of the detector of the locked loop circuit, the detector providing a control voltage; and a voltage controlled ring oscillator having harmonic frequency components, the oscillator comprising:

a first, second and third inverter each with an input and an output, the output of the first inverter electrically coupled with the input of the second inverter, the output of the second inverter electrically coupled with the input of the third inverter, the output of the third inverter electronically coupled with the input of the first inverter, propagation delays of each inverter controlled by the control voltage; and a first, second and third summing component, the summing components each having one end electrically coupled to an output of the first, second and third inverters respectively, the other ends of the summing components being commonly electrically connected at a common harmonic frequency output node;

the output of the third inverter providing a fundamental output frequency applied to a second input of the detector;

the summing components passively coupling the harmonic frequency components of ring oscillator such that constructive summation of harmonic frequency components occurs for those frequency components, F(t), of a multiple, n, being an odd multiple of three in accordance with the formula $$F(t)=a_n\cos(n(\omega t))$$

where (n=3, 9, 15, . . . );

the constructively summed harmonic frequency components being provided at the common harmonic frequency output node, the third-harmonic frequency component at the common harmonic frequency output node having the highest amplitude.

8. The frequency synthesizer of claim 7, wherein the frequency translational element is a multiplier.

9. The frequency synthesizer of claim 7, further comprising a divider coupled between the output of the third inverter of the ring oscillator and the second input of the detector, and wherein the frequency translation element is a divider.

10. The frequency synthesizer of claim 7, wherein the loop circuit is a phase locked loop and the detector is a phase detector.

11. The frequency synthesizer of claim 7, wherein each summing component of the voltage controlled ring oscillator is a passive component selected from at least one of the group consisting of resistors, capacitors and inductors.

12. The frequency synthesizer of claim 7, wherein the summing components of the voltage controlled ring oscillator are capacitors.

13. The frequency synthesizer of claim 7, wherein the third-harmonic frequency output from the voltage controlled ring oscillator is electrically coupled to a discrete power transistor to provide a buffered third-harmonic frequency signal.

14. The frequency synthesizer of claim 7, wherein the voltage controlled ring oscillator and locked loop circuit are provided on an integrated circuit.

15. The frequency synthesizer of claim 7, wherein the voltage controlled ring oscillator provides a multiplied frequency having a period approaching approximately two inverter propagation delays.

16. The frequency synthesizer of claim 7, further comprising a low-pass loop filter coupled between the detector and the voltage controlled ring oscillator such that the control voltage is filtered.

17. A communication device having at least one of a transmitter and a receiver and having a frequency synthesizer including a reference oscillator being coupled to a first divider providing a first divided signal, comprising:

a phase locked loop including a phase detector, the first divided signal being coupled to a first input of the phase detector of the phase locked loop, the detector providing a control voltage; and a voltage controlled ring oscillator having harmonic frequency components, the oscillator comprising:

a first, second and third inverter each with an input and an output, the output of the first inverter electrically coupled with the input of the second inverter, the output of the second inverter electrically coupled with the input of the third inverter, the output of the third inverter electrically coupled with the input of the first inverter, propagation delays of each inverter controlled by the control voltage; and a first, second and third summing capacitor, the summing capacitors each having one end electrically coupled to an output of the first, second and third inverters, respectively, the other ends of the summing capacitors being commonly electrically connected at a common harmonic frequency output node;

the output of the third inverter providing a fundamental output frequency to a second divider which applies a second divided signal to a second input of the phase detector;

the summing capacitors passively coupling the harmonic frequency components of ring oscillator such that constructive summation of harmonic frequency components occurs for those frequency components, F(t), of a multiple, n, being an odd multiple of three in accordance with the formula $$F(t)=a_n\cos(n(\omega t))$$

where (n=3, 9, 15 . . . );

the constructively summed harmonic frequency components being provided at the common harmonic frequency output node, the third-harmonic frequency component at the common harmonic frequency output node having the highest amplitude and being provided for the frequency synthesizer.

18. The communication device of claim 17, wherein the third-harmonic frequency output from the frequency synthesizer is capacitively coupled to a discrete power device to provide a buffered third-harmonic frequency signal.

19. The communication device of claim 17, wherein the voltage controlled ring oscillator and phase locked loop of the frequency synthesizer are provided on a CMOS integrated circuit.

\* \* \* \* \*